United States Patent
Migita (10) Patent No.: US 7,651,571 B2
(45) Date of Patent: Jan. 26, 2010

(54) SUSCEPTOR

(75) Inventor: Yasushi Migita, Kagoshima (JP)

(73) Assignee: Kyocera Corporation (JP)

( * ) Notice: Subject to any disclaimer, the term of this patent is extended or adjusted under 35 U.S.C. 154(b) by 182 days.

(21) Appl. No.: 11/614,352

(22) Filed: Dec. 21, 2006

(65) Prior Publication Data

US 2007/0144442 A1    Jun. 28, 2007

(30) Foreign Application Priority Data

Dec. 22, 2005    (JP)    ............... 2005-370336

(51) Int. Cl.
*H01L 21/306*    (2006.01)
*C23C 16/00*    (2006.01)

(52) U.S. Cl. .................. 118/728; 156/345.51

(58) Field of Classification Search ........... None
See application file for complete search history.

(56) References Cited

U.S. PATENT DOCUMENTS

| | | | | |
|---|---|---|---|---|
| 5,275,683 | A * | 1/1994 | Arami et al. | 156/345.51 |
| 5,622,593 | A * | 4/1997 | Arasawa et al. | 156/345.27 |
| 5,942,042 | A * | 8/1999 | Gogh | 118/728 |
| 6,210,486 | B1 * | 4/2001 | Mizukami et al. | 118/728 |
| 6,344,105 | B1 * | 2/2002 | Daugherty et al. | 156/345.51 |
| 2002/0170882 | A1 * | 11/2002 | Akiba | 216/67 |
| 2004/0040656 | A1 * | 3/2004 | Hengel et al. | 156/345.14 |
| 2004/0134618 | A1 * | 7/2004 | Endoh et al. | 156/345.51 |
| 2005/0099135 | A1 * | 5/2005 | Landis et al. | 315/111.41 |

FOREIGN PATENT DOCUMENTS

| | | |
|---|---|---|
| JP | 2000-114538 | 4/2000 |
| JP | 2003-168725 | 6/2003 |
| JP | 2003-179129 | 6/2003 |

* cited by examiner

*Primary Examiner*—Michael Cleveland
*Assistant Examiner*—Nathan K Ford
(74) *Attorney, Agent, or Firm*—Volpe and Koenig, P.C.

(57) ABSTRACT

The present invention provides a susceptor including a plate member having an upper surface on which a substrate is placed and a lower surface, a base member bonded to the lower surface of the plate member with a bonding layer, and an annular protective member disposed in an annular recess formed along a rim of a bonding portion of the plate member and the base member, in which a space is formed between the lower surface of the plate member and an upper surface of the protective member and/or between an upper surface of the base member and a lower surface of the protective member. The susceptor can inhibit generation of particles resulting from plasma corrosion, and can suppress extensive leakage of gas from a space or a gap between the plate member and a substrate.

20 Claims, 8 Drawing Sheets

SUSCEPTOR

CROSS-REFERENCE TO RELATED APPLICATIONS

The present application claims priority under 35 U.S.C. §119 to Japanese Patent Application No. 2005-376336, filed Dec. 22, 2005, entitled "SUSCEPTOR." The contents of this application are incorporated herein by reference in their entirety.

BACKGROUND OF THE INVENTION

1. Field of the Invention

The present invention relates generally to susceptors for holding workpieces in deposition apparatuses such as chemical vapor deposition (CVD), physical vapor deposition (PVD), and sputtering apparatuses and processing apparatuses such as etching apparatuses. In particular, the present invention relates to a susceptor suitable for electrostatic chucking.

2. Description of the Related Art

In a process for manufacturing a semiconductor device, a semiconductor-manufacturing apparatus, such as a deposition apparatus for forming a thin film on a semiconductor wafer (simply referred to as "wafer" hereinafter) or an etching apparatus for conducting etching has been used. The semiconductor-manufacturing apparatus has a susceptor for holding a semiconductor wafer.

Figure 7:
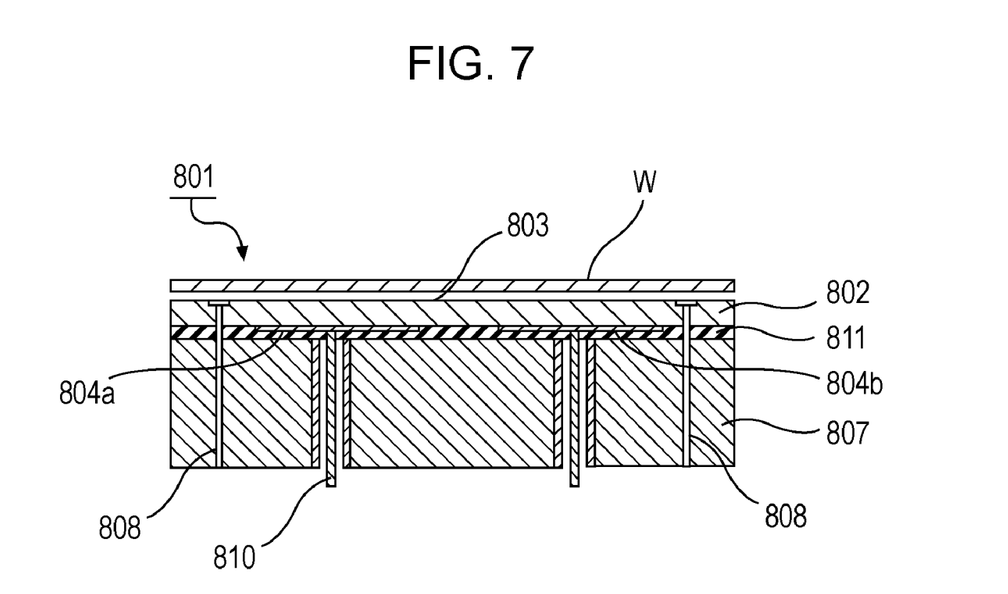
FIG. 7 is a cross-sectional view showing an example of an existing susceptor.

For example, a susceptor 801 shown in FIG. 7 includes a ceramic plate member 802 having an upper surface that functions as a supporting surface 803 on which a wafer W is placed and a lower surface provided with a pair of electrodes 804a and 804b for electrostatic chucking, and a metal base member 807 bonded onto the lower surface of the plate member 802. Gas supply holes 808 penetrating the plate member 802 and the base member 807 are formed near the rim of the supporting surface 803. When the wafer W is placed on the supporting surface 803, a voltage is applied between the pair of the electrodes 804a and 804b for electrostatic chucking to generate electrostatic force and to thereby cause the wafer to attach on the supporting surface 803. Moreover, the heat conductivity between the wafer W and the supporting surface 803 is increased by supplying heat-conductive gas, such as helium, through the gas supply holes 808 to a minute space between the wafer W and the supporting surface 803 so that the surface temperature of the wafer W is uniform.

However, when such a susceptor 801 is repeatedly exposed to plasma-enhanced deposition or various reaction gas for etching and the like in the semiconductor-manufacturing process, plasma or the like would corrode the side surface of a bonding layer 811, thereby causing generation of particles. If the corrosion progresses further, there is a risk of dielectric breakdown between the plasma and the electrodes 804a and 804b for electrostatic chucking. Moreover, corrosion by plasma and the like may form holes in the bonding layer 811 around the gas supply holes 808, and the heat-conductive gas such as helium may leak from these holes. This possibly leads to problems such as a decrease in degree of vacuum inside the chamber a decrease in yields of the resulting products.

Figure 8:
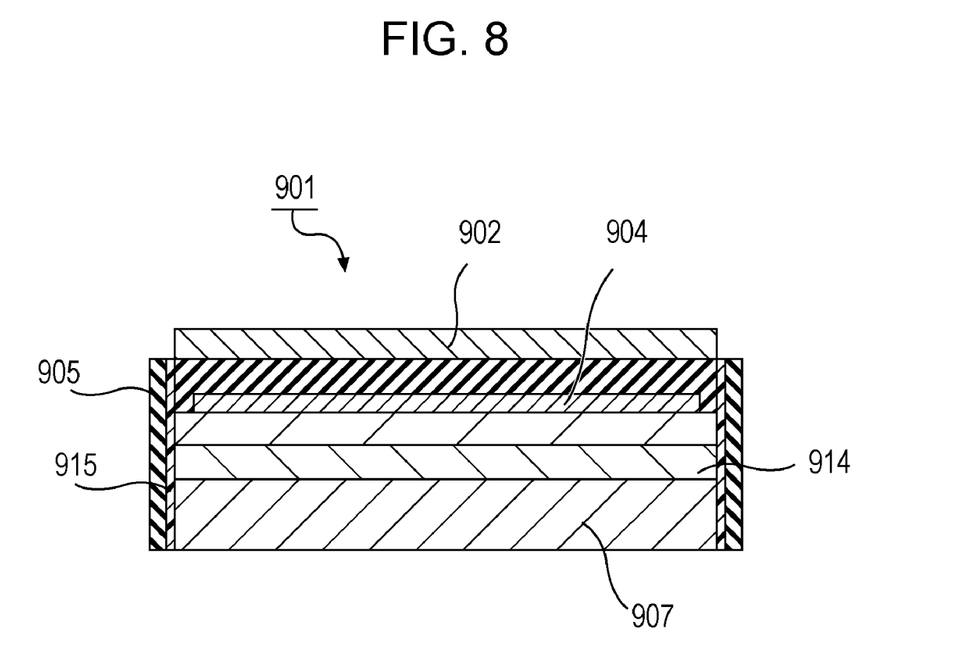
FIG. 8 is a cross-sectional view showing another example of an existing susceptor.

In order to overcome these problems, a shown in FIG. 8, there has been proposed an electrostatic chuck 901 in which at least a bonding layer 914, an electrode 904, and a chucking layer 902 are provided on a base member 907, the electrostatic chuck 901 having a side surface provided with a corrosion-resistant insulator 905 for preventing corrosion of the bonding layer 914 by plasma of the like. In this bonding layer 914, a rubber component is added to the adhesive to impart elasticity to the bonding layer 914 so that deformation of the chucking layer 902 can be prevented due to this elasticity even when volume of the bonding layer 914 is changed.

The corrosion-preventing insulator for presenting corrosion by plasma is a film containing a fluorocarbon resin or a silicone resin bonded on the side surface with an adhesive 915 containing a fluorocarbon resin or a silicone resin. Since the supporting surface on which the substrate is placed deforms when heated with plasma or etching gas applied from above, gaps will be formed between the plate member 802 and the wafer W near the rim of the wafer W. This disadvantageously leads to a problem of extensive leakage of gas supplied from a gas groove 112 in an amount exceeding the set value. Moreover, since the bonding layer 914 is exposed, plasma or etching gas is repeatedly applied to the bonding layer 914 from above. Thus, there have been problems of corrosion of the adhesive and generation of particles.

SUMMARY OF THE INVENTION

The present invention has been made to overcome the problems described above and aims to provide a susceptor that can inhibit generation of particles resulting from plasma corrosion of a bonding layer between a base member and a plate member, that can suppress extensive leakage of gas from the space between the plate member and a substrate in an amount larger than the set value, and that can suppress abnormal leakage of gas from any gap between the plate member and the substrate.

The present invention provides a susceptor including a plate member having an upper surface on which the substrate is placed and a lower surface; a base member bonded to the lower surface of the plate member with a bonding layer; and an annular protective member disposed in an annular recess formed along a rim of a bonding portion of the plate member and the base member, in which a space is formed between the lower surface of the plate member and an upper surface of the protective member and/or between an upper surface of the base member and a lower surface of the protective member. This structure suppresses generation of particles by corrosion of the bonding layer of the base member and the plate member by plasma. Moreover, the supporting surface on which the substrate is placed can be prevented from being thermally deformed by plasma or etching gas applied from above. Thus, the gas filled between the plate member and the substrate is prevented from leaking through gaps generated between the plate member and the substrate in an amount larger than the set value or from abnormally leaking through any gap between the plate member and the substrate.

DESCRIPTION OF THE PREFERRED EMBODIMENTS

The preferred embodiments of the present invention will now be described using an example of an electrostatic chuck for processing a wafer.

Figure 1A:
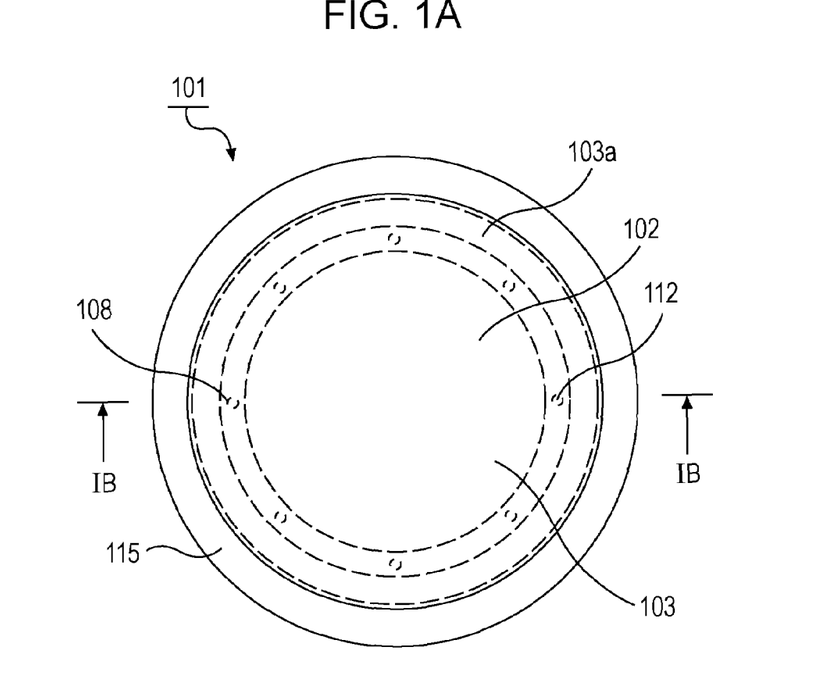
FIG. 1A is a schematic plan view showing an example of a susceptor of the present invention and FIG. 1B is a schematic cross-sectional view taken along line IB-IB in FIG. 1A.
Figure 1B:
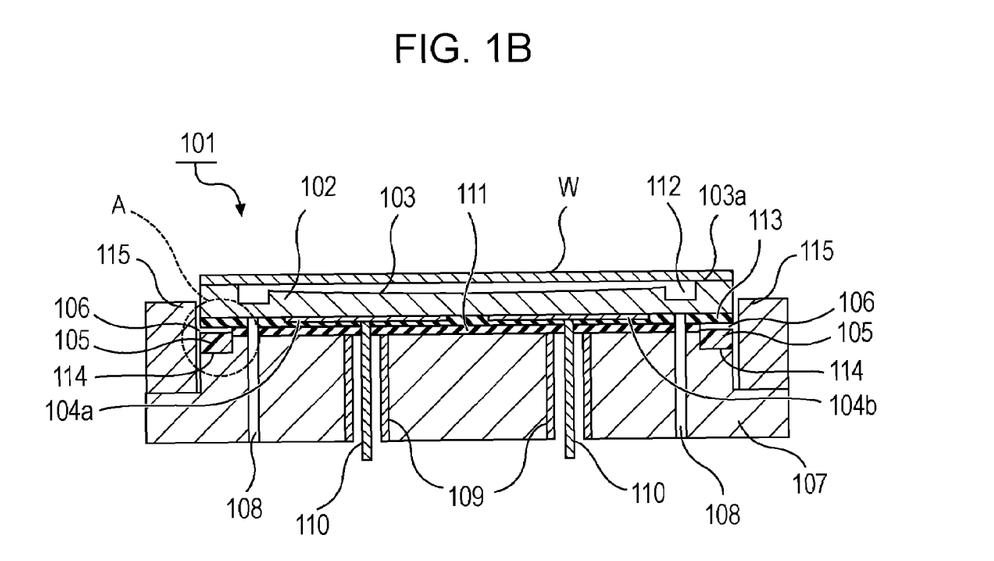

FIG. 1A is a schematic front view showing an example of a susceptor 101 of the present invention. FIG. 1B is a schematic cross-sectional view taken along line IB-IB of FIG. 1A.

The susceptor 101 includes an electrostatic chucking unit and a base member 107 bonded thereto with a bonding layer 111. The electrostatic chucking unit includes a plate member 102 and electrodes 104 for electrostatic chucking, and may further include an insulating film 113 if necessary.

The plate member 102 has an upper surface that functions as a supporting surface 103 on which a substrate W to be subjected to a deposition process or etching process can be placed. The supporting surface 103 is formed in one of the main surfaces of the plate member 102 and can have a substrate, such as a semiconductor wafer W, placed thereon. The other main surface of the plate member 102 is provided with a pair of electrodes 104a and 104b for electrostatic chucking. The electrodes 104a and 104b may be covered and protected with the insulating film 113 to enhance insulation. From the standpoint of insulation protection, the insulating film 113 is preferably larger than the electrodes 104 in terms of area and is preferably provided on the substantially entire surface of the other main surface of the plate member.

Because the electrodes 104a and 104b are provided on the other main surface of the plate member 102, the thickness of the insulating layer of the plate member 102 can be made uniform. Furthermore, the chucking force at the supporting surface 103 can be made uniform. For the purpose of this specification, the phrase "thickness of insulating layer" refers to the distance from the supporting surface 103 to the electrodes 104a and 104b. For example, when the electrodes 104a and 104b are provided on the other main surface of the plate member 102, the thickness of the insulating layer equals to the thickness of the plate member 102. When the electrodes 104a and 104b are disposed inside the plate member 102, the thickness of the insulating layer is the distance from the supporting surface 103 to the electrodes 104a and 104b.

Note that although FIG. 1B illustrates a large gap between the supporting surface 103 and the wafer W, the wafer W becomes closely attached on the supporting surface 103a once voltage is applied to the electrodes 104a and 104b.

The base member 107 may be composed of a material having high heat conductivity, e.g., a metal. The lower surface of the electrostatic chucking unit including the plate member 102 and the electrodes 104a and 104b is bonded to the upper surface of the base member 107 with the insulating bonding layer 111.

A plurality of gas supply holes 108 penetrating the electrostatic chucking unit and the base member 107 are formed in a rim region 103a of the supporting surface 103. When the wafer W is chucked and held on the supporting surface 103, gas is confined in the space formed by the portion of the supporting surface 103 at the outer side of a gas groove 112 and the rim of the wafer W. When heat-conducting gas such as helium is supplied through the gas supply holes 108 near the rim of the supporting surface 103, the gas fills the space between the wafer W and the supporting surface 103. This gas can enhance heat conduction and can cool the wafer W in a uniform manner.

Figure 2A:
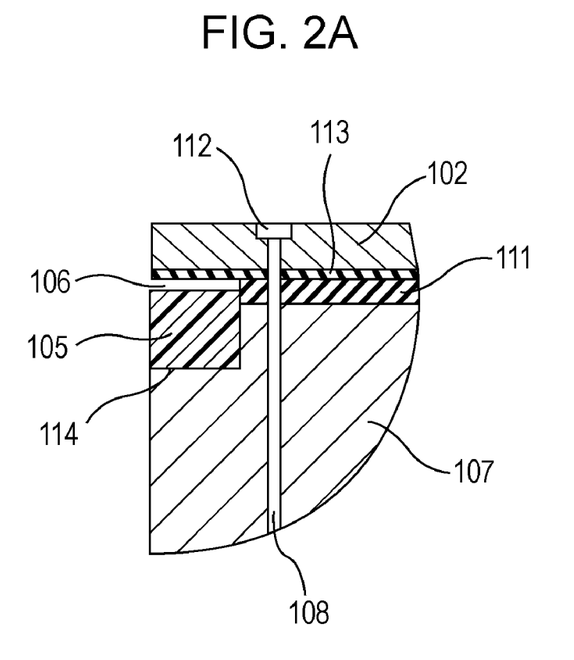
FIGS. 2A and 2B are each a schematic enlarged cross-sectional view of portion A of the susceptor of the present invention in FIG. 1B.
Figure 2B:
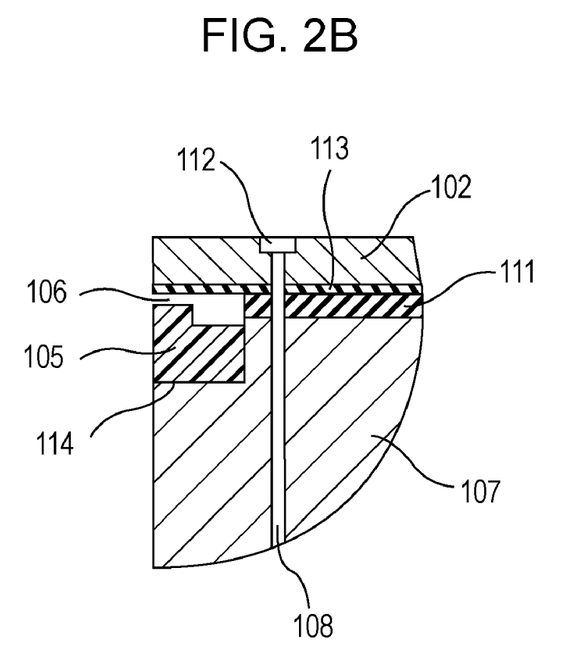

The susceptor 101 of the present invention has an annular recess 114 along the rim of the bonding portion of the plate member 102 and the base member 107 and an annular protective member 105 disposed inside the recess 114. There is a space 106 between the lower surface of the plate member 102 and the upper surface of the protective member 105 and/or between the upper surface of the base member 107 and the lower surface of the protective member 105. FIGS. 2A and 2B are each a partial enlarged diagram schematically showing portion A in FIG. 1. The recess 114 is formed below the rim portion of the plate member 102 composed of a ceramic with high resistance to plasma, and the protective member 105 is disposed in the recess 114. In this manner, even when a guard ring 115 for protecting the base member 107 from plasma is provided on the outer periphery of the plate member 102, a space can be retained so that the base member 107 is substantially prevented from being exposed to plasma entering the space between the plate member 102 and the guard ring 115. Furthermore, the bonding layer 111 can also be protected from being directly exposed to plasma.

When there is a space 106 between the lower surface of the plate member 102 and the upper surface of the protective member 105 and/or between the upper surface of the base member 107 and the lower surface of the protective member 105, the rim portion of the plate member 102 is prevented from being pushed upward by thermal expansion of the protective member 105 in the vertical direction (vertical direction in FIG. 1A) even when the temperature is increased by the deposition process or etching process of the wafer W. Furthermore, the change in shape of the rim region 103a of the supporting surface 103 can be suppressed, and the increase in leakage of helium gas can be suppressed since the gas filled in the space between the wafer W and the supporting surface 103 remains sealed.

The space 106 is preferably in the range of 0.01 to 0.1 mm, and more preferably in the range of 0.01 to 0.05 mm. The space 106 satisfying this range can suppress the rim portion of the plate member 102 from being pushed upward even when the protective member 105 is thermal expanded in the vertical direction. Moreover, the change in shape of the supporting surface 103 can be reduced, and it becomes easier to suppress an increase in amount of leaking helium gas. Furthermore, corrosion of the bonding layer 111 by plasma entering the space 106, generation of particles, and occurrence of dielectric breakdown can be effectively suppressed.

Figure 3A:
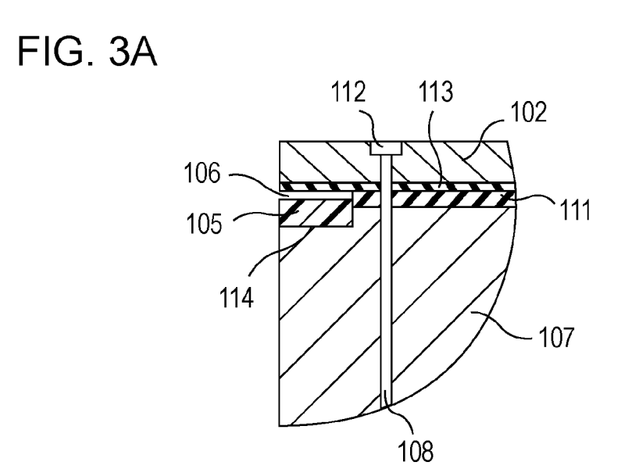
FIGS. 3A, 3B, and 3C are each a schematic view showing the cross-sectional shape of a recess formed in the susceptor of the present invention.
Figure 3B:
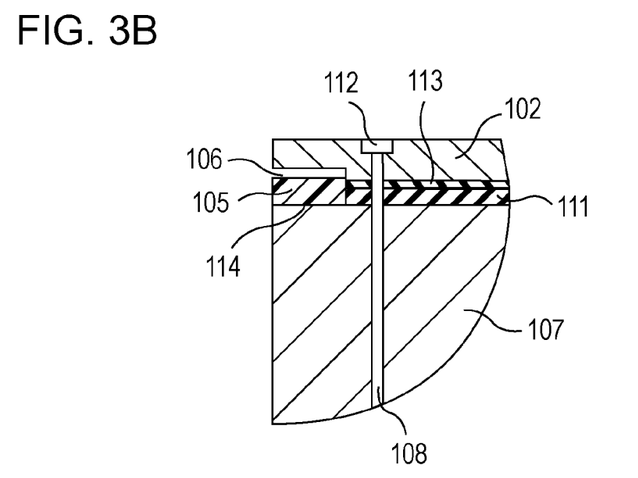

FIGS. 3A to 3C are partial enlarged views showing other embodiments of the recess 114 in part A in FIG. 1B. As shown in FIGS. 3A and 3B, the recess 114 is preferably formed in the rim portion of the base member 107 or in the rim portion of the plate member 102. Formation of the recess 114 in the rim portion of the base member 107 as shown in FIG. 3A is effective if the thickness of the plate member 102 is small, i.e., 2 m or less. Formation of the recess 114 in the rim portion of the plate member 102 is particularly effective when the thickness of the plate member 102 is 5 mm or more. According to the structure of FIG. 3B, the protective member 105 completely covers the bonding layer 111 and prevents the bonding layer 111 from being directly exposed to a plasma atmosphere; thus, the bonding layer 111 can be more effectively protected.

Figure 3C:
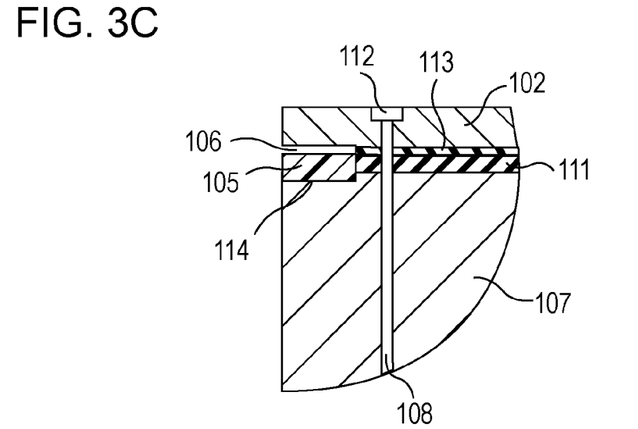

As shown in FIG. 3C, the recess 114 is preferably formed across in both the plate member 102 and the base member 107. This arrangement is particularly effective when the thickness of the plate member 102 is 2 to 5 mm. According the structure in FIG. 3C, the bonding layer 111 can be completely covered with the protective member 105. Thus, the bonding layer 111 can be more securely protected from plasma.

When the protective member 105 is disposed in the recess 114, the rim of the protective member 105 is preferably located at the same position as or at the inner side of the rim of the plate member 102. If the protective member 105 protrudes from the rim of the plate member 102, the corner of the protective member 105 may be corroded with plasma, resulting in generation of particles. If the rim of the protective member 105 is at the same position as or at the inner side of the rim of the plate member 102, corrosion of the protective member 105 can be suppressed.

Figure 4A:
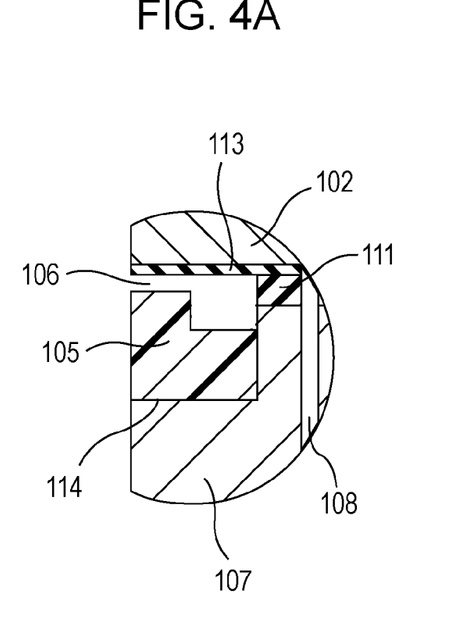
FIGS. 4A to 4D are each a schematic view showing a cross-sectional shape of a protective member incorporated in the susceptor of the present invention.

FIGS. 4A to 4D are schematic views each showing an example of a cross-sectional shape of the protective member 105 incorporated in the susceptor 101 of the present invention. As shown in FIG. 4A, the cross-section of the protective member 105 is preferably step-shaped such that the upper surface near the rim is high and the upper surface remote from the rim is low. This is because when the protective member 105 is thermally expanded by an amount larger than the space 106, the area of the protective member 105 that comes into contact with the plate member 102 can be decreased in this manner and thus the force of pushing the plate member 102 upward can be decreased even when the protective member 105 is expanded in the upward direction. Accordingly, deformation of the supporting surface 103 can be reduced, and plasma is prevented from entering the bonding layer 111 from the rim.

Figure 4B:
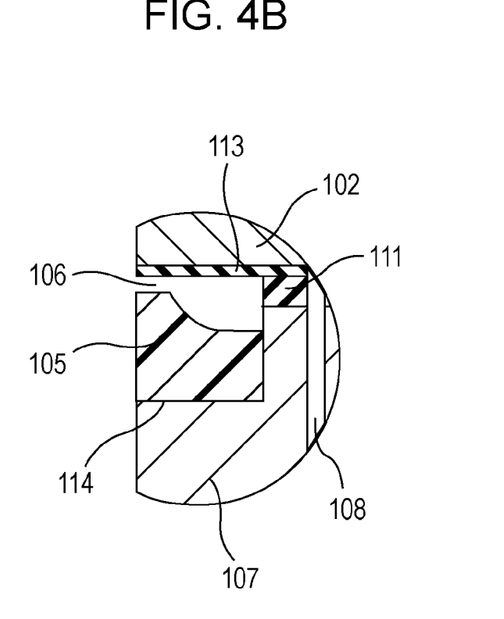
Figure 4C:
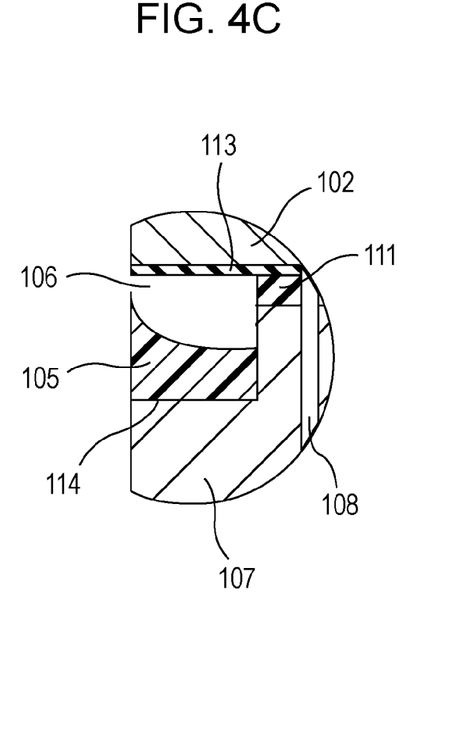
Figure 4D:
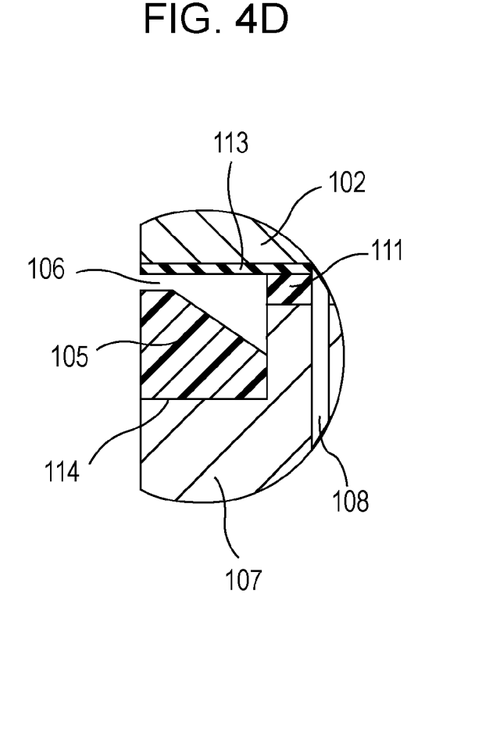

As shown in FIGS. 4B to 4D, the cross-section of the protective member 105 may be declined from the portion near the rim toward the inner side. This is due to the following reasons: As is described above, when the temperature of the susceptor 101 is elevated and the protective member 105 is thermally expanded by an amount larger than the space 106, the area of the protective member 105 that comes into contact with the plate member 102 can be decreased in this manner and thus the force of pushing the plate member 102 upward can be decreased even when the protective member 105 is expanded in the upward direction. Accordingly, deformation of the supporting surface 103 can be reduced.

The Young's modulus of the protective member 105 is preferably larger than that of the bonding layer 111. In bonding the plate member 102 to the base member 107 with the bonding layer 111, the adhesive may flow into part of the space 106 between the plate member 102 and the protective member 105. However, when the protective member 105 is thermally expanded upward by an increase in operation temperature during wafer processing, the bonding layer 111 can absorb this expansion since the Young's modulus of the protective member 105 is larger than that of the bonding layer 111. Thus the cross-section of the protective member 105 is prevented from being irregularly deformed and from protruding from the rim of the plate member 102. Therefore, the protective member 105 is prevented from being exposed to plasma.

The protective member 105 is preferably composed of a fluorocarbon resin. Fluorocarbon resins have resistance to plasma corrosion and suppress generation of particles. Of the fluorocarbon resins, Teflon® resin having particularly high resistance to plasma is preferred as the material of the protective member 105. Teflon® is preferred since it can be subjected to precise machining and it can be easily and accurately worked into a protective member 105 having a cross-sectional shape shown in any one of FIGS. 4A to 4D with high dimensional accuracy. Precise machining facilitates accurate adjustment of the space and effectively suppresses deformation of the supporting surface.

The protective member 105 composed of a fluorocarbon resin or the like is preferably thermally fitted to the recess 114 as follows: The protective member 105 is processed so that the diameter of the inner rim is slightly smaller than the diameter of the inner rim of the recess 114 before bonding the plate member 102 onto the base member 107. The protective member 105 is then thermally expanded by maintaining a temperature near 100° C. so that the protective member 105 is thermally expanded to be larger than the outer diameter of the inner rim of the recess 114 and subsequently fitted to the recess 114. Subsequently, the outer diameter and the thickness may be adjusted by lathe-machining or the like to obtain a desired shape. This thermal fitting process is particularly advantageous for presenting generation of particles since the protective member 105 can be fitted in the recess 114 without using any adhesives or the like.

The protective member 105 is preferably composed of a ceramic. The protective member 105 is more preferably composed of a ceramic containing at least one of $Al_2O_3$, SiC, AlN, and $Si_3N_4$ as the main component since higher corrosion resistance can be imparted. Among these materials, a ceramic sintered body containing $Al_2O_3$ or AlN as the main component is preferred from the standpoint of corrosion resistance in halogen-based corrosive gas or plasma. Since a ceramic sintered body containing $Al_2O_3$ or AlN as the main component is brittle, the outer dimensions and the thickness can be worked at an accuracy of 10 micron or less. Thus, the ceramic sintered body can facilitate precise working such as forming the space 106, forming the protective member 105 into a desired cross-sectional shape, and forming the protective member 105 at the same position as or at the inner side of the rim of the plate member 102.

Figure 5A:
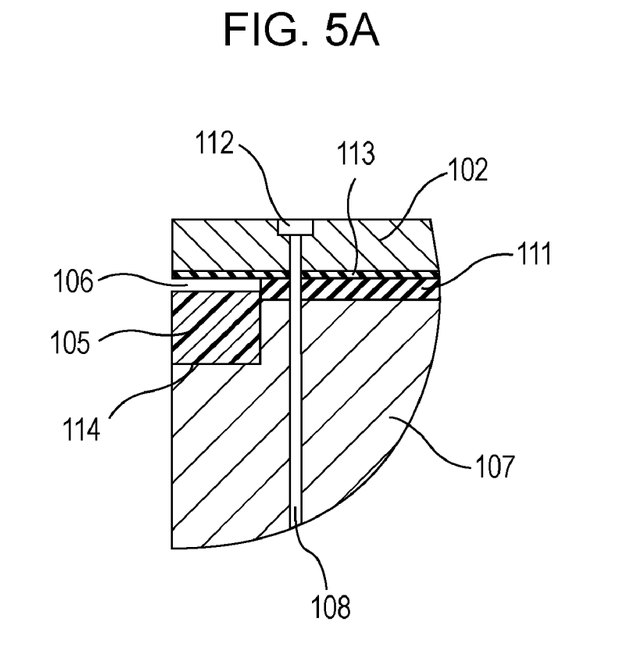
FIGS. 5A and 5B are each a schematic cross-sectional view showing the position of forming a space in the susceptor of the present invention.
Figure 5B:
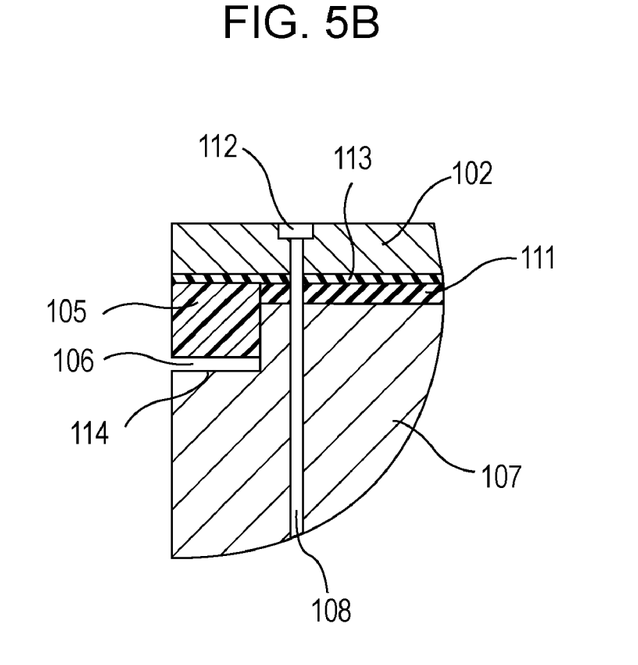

FIGS. 5A and 5B are each a schematic cross-sectional view showing the position of forming the space in the susceptor of the present invention. As shown in FIG. 5A, the space 106 is preferably formed between the lower surface of the plate member 102 and the upper surface of the protective member 105. This is because the space 106 prevents the protective member 105 from coming into contact with the plate member 102 even when the operation temperature is elevated during wafer processing and the protective member 105 extends upward by thermal expansion. In this manner, the protective member 105 is prevented from pushing the plate member 102 upward. As shown in FIG. 5B, the same effect as the structure shown in FIG. 5A can be obtained by forming the space 106 between the lower surface of the protective member 105 and the upper surface of the base member 107.

The side of the bonding layer 111 is preferably annularly surrounded by the protective member 105. In this manner, when the susceptor 101 of the present invention is used in a plasma environment, the bonding layer 111 can be shielded from plasma by the protective member 105 and prevented from being corroded. Moreover, generation of particles can be suppressed.

Figure 6A:
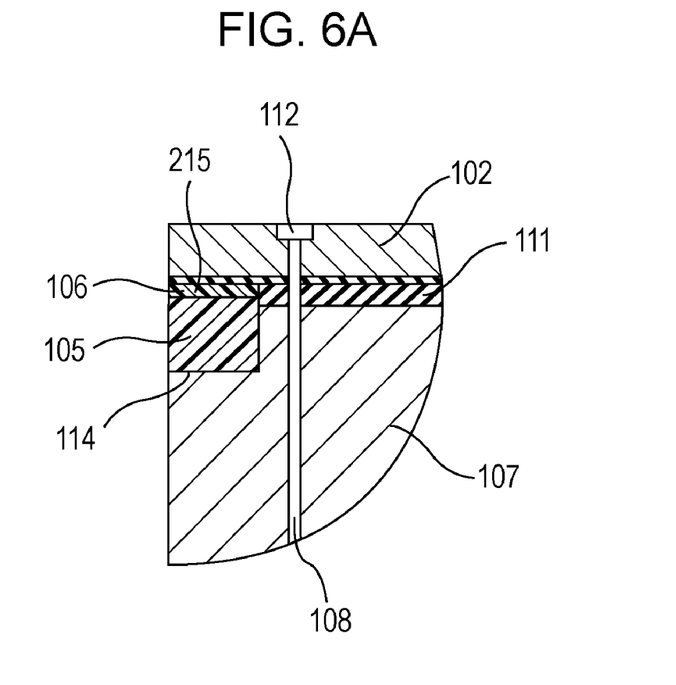
FIGS. 6A and 6B are each a schematic partial enlarged view of portion A in which a bonding layer is formed in the space between the protective member and the plate member in the susceptor of the present invention.
Figure 6B:
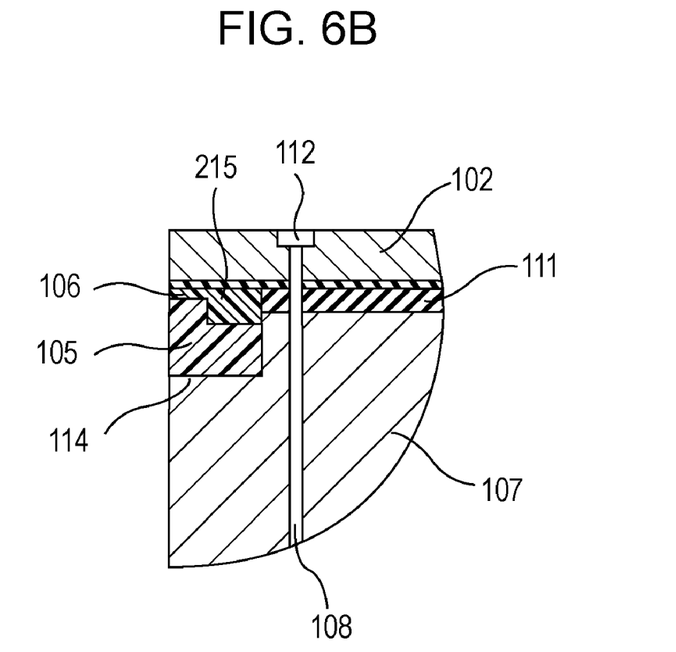

FIGS. 6A and 6B are each a schematic diagram showing an example of the cross-sectional shape of the protective member 105 incorporated in the susceptor 101 of the present invention. As shown in FIGS. 6A and 6B, the space 106 is preferably filled with an adhesive 215. If the adhesive 215 is not filled in the space 106, plasma will be concentrated in the corner portions of the protective member 105 and the plate member 102 that define the space 106, and the corner portions of the plate member 102 or the protective member 105 would be corroded, possibly resulting in generation of particles. When the adhesive 215 is filled in the space 106 so that no corners are present in the surface, concentration of plasma will be suppressed and generation of particles will be reduced.

In this case, the adhesive 215 filling the space 106 is preferably a silicone adhesive having high resistance to plasma and forming a rubbery elastic member after cure. This is due to the following reason: When the operation temperature during wafer processing is elevated and the protective member 105 is thermally expanded upward, the elastic silicone adhesive can reduce the upward pushing force of the protective member 105 and the plate member 102 can be prevented from deformation. A preferable example of the adhesive 215 is TSE-3360 produced by GE Toshiba Silicone Co., Ltd.

The adhesive 215 preferably has an elongation of 100% or more after cure. This is because when the operation temperature is elevated in wafer processing and the protective member 105 is thermally expanded in the vertical direction, the adhesive 215 will easily contract so that the stress applied to the plate member 102 can be reduced and the plate member 102 can be prevented from being pushed upward. In contrast, if the elongation of the adhesive 215 is less than 100% after cure and the protective member 105 is thermally expanded in the vertical direction, the contraction of the adhesive 215 will not be sufficient and the plate member 102 will be pushed upwards. As a result, the supporting surface 103 would be deformed, a space would be generated between the wafer W and the plate member 102, helium would leak, and the surface temperature of the wafer W would not be uniform. Note that the "elongation after cure" is determined by pulling a cured body of an adhesive having a unit length at a predetermined force and is calculated as a ratio of the elongation to break to the initial length before pulling. A larger elongation indicates higher softness of the elastic member and higher tendency to contract upon compression.

Moreover, an electrode 104 for electrostatic chucking is preferably provided inside the plate member 102 or between the plate member 102 and the base member 107. When the wafer W is chucked onto the supporting surface 103 by electrostatic force, the distance between the wafer W and the supporting surface 103 can be uniformly decreased, and leakage of helium gas can be reduced. As a result, the surface temperature of the wafer W can be made uniform. In particular, since the wafer W is heated by the heat generated from the plasma in a plasma atmosphere, the wafer W is electrostatically chucked onto the supporting surface 103 and heat-conducting gas such as helium is supplied between the wafer and the supporting surface 103 to facilitate cooling of the wafer W. If the amount of leaking helium gas increases, it will no longer be possible to uniformly cool the wafer W, and thus the surface temperature of the wafer W will be nonuniform. Thus, yield in deposition process or etching process would be decreased.

The electrode 104 may be formed inside the plate member 102. For example, a plate member 102 may be produced by forming the electrode 104 for electrostatic chucking on a ceramic green sheet by a printing method, placing another ceramic green sheet thereon to form a composite of a plurality of ceramic green sheets, pressing the ceramic green sheets to form a compact, and subjecting the compact to debinding, sintering, and grinding processes. It is preferable to embed the electrode 104 in the plate member 102 since corrosion by plasma can be suppressed.

Another method for forming the electrode 104 for electrostatic chucking includes forming an electrode 104 on a surface of the plate member 102 opposite the supporting surface 103 and protecting the supporting surface 103 with the insulating film 113 to form means for producing static electricity. The electrode 104 formed on this opposite main surface of the plate member 102 may be composed of a metal such as Ni, Ti, Ag, Cu, Au, Pt, Mo, or Mn, an alloy thereof, TiN, TiC, or WC. The electrode 104 may be a conductor layer having a thickness of 0.1 µm or more that can be deposited by a film-forming method such as sputtering, ion-plating, vapor deposition, plating, chemical vapor deposition, or the like. Subsequently, the conductor layer is subjected to blasting or etching to remove unnecessary portions of the conductor layer to thereby form the electrode 104 for electrostatic chucking. By forming the electrode 104 on the surface of the plate member 102 as described above, the distance between the electrode 104 and the supporting surface 103 becomes more reliably constant, and it is possible to produce an electrostatic chuck exhibiting uniform chucking force across the supporting surface 103.

A heater is preferably formed inside the plate member 102 or between the plate member 102 and the base member 107. In this manner, the wafer W can be heated to a desired temperature, and it becomes possible to use the susceptor 101 in various semiconductor processes, i.e., one susceptor 101 can be used in various different processes.

As with the electrode 104, the heater may be formed inside the plate member 102. This is possible by forming a heating electrode on a ceramic green sheet by a printing method, placing another ceramic green sheet thereon to form a composite of a plurality of ceramic green sheets, pressing the composite to form a compact, and subjecting the compact to debinding, sintering, and grinding processes to obtain the plate member 102 with a heater therein.

In each of the structures described above, the electrode 104 or the heater is preferably provided inside the plate member 102 or between the plate member 102 and the base member 107. This is because gas can be supplied to and can fill the space between the wafer W and the supporting surface 103, the heat conductivity between the wafer W and the supporting surface 103 is increased, and the temperature difference across the wafer W can thus be minimized. Moreover, since the temperature of the wafer W can be adjusted with the heater, the susceptor 101 can be used in various deposition apparatuses and etching apparatuses.

The plate member 102 is preferably composed of a ceramic having excellent corrosion resistance. It is important to use a ceramic sintered body containing at least one of $Al_2O_3$, SiC, AlN, and $Si_3N_4$ as the main component in order to achieve high corrosion resistance. Among these materials, a ceramic sintered body containing $Al_2O_3$ or AlN as the main component is preferred from the standpoint of corrosion resistance in halogen-based corrosive gas or plasma. To reduce the cost for production, a ceramic sintered body containing $Al_2O_3$ as the main component is preferably used. When thermal uniformity is required for the wafer, a ceramic sintered body containing AlN having a heat conductivity of 100 W/(m·K) or more as the main component is preferably used.

The base member 107 is composed of a ceramic, aluminum, a cemented carbide, or a metal-ceramic composite material. The base member 107 has through holes for extracting leads 110 connecting to the electrodes 104a and 104b for electrostatic chucking.

In order to use the base member 107 as a plasma electrode for generating the plasma above the wafer W, the base member 107 is preferably composed of a metal-ceramic composite material having a volume resistivity value of 10 Ω·cm or less or aluminum or a cemented carbide having a smaller volume resistivity value.

In order to discharge heat from the wafer W through the base member 107 to the exterior of the base member 107, the heat conductivity of the base member 107 is 50 W/(m·K) or more and preferably 100 W/(m·K) or more.

In the susceptor 101 of the present invention, the wafer W is placed on the supporting surface 103, and a DC voltage is applied to the electrodes 104a and 104b for electrostatic chucking to electrostatically chuck the wafer W on the supporting surface 103. Moreover, plasma can be generated above the wafer W so that the wafer W can be subjected various types of deposition and etching processes.

Although a susceptor with a dipole-type electrostatic chuck is described as an example in this embodiment, the effects of the present invention can still be obtained by using a single-pole electrostatic chuck.

Naturally, the present invention is applicable to improvements and modifications within the essential range of the present invention.

A production method of the present invention will now be described.

The plate member 102 is made by working a ceramic sintered body into a predetermined outer diameter and a predetermined thickness, forming a conductor layer thereon by plating, and removing unnecessary portions by blasting to form the electrode 104. In order to ensure insulation between the electrode 104 and the base member 107, the electrode 104 may be covered and protected by an insulating film such as a polyimide film if necessary.

The base member 107 is composed of a ceramic, aluminum, a cemented carbide, or a metal-ceramic composite material and has a channel for cooling inside. By circulating a coolant or the like in this channel, heat generated on the wafer W by plasma can be discharged outside the system. The surface of the base member 107 is preferably surface-treated to form an alumite or the like.

The protective member 105 is formed as an annular member having an inner diameter smaller than the outer diameter of the bonding surface of the base member 107. The protective member 105 is thermally expanded and press-fitted after the protective member 105 became larger than the outer diameter of the base member 107. It is optimum to press-fit the protective member 105 composed of Teflon® resin by heating at about 100° C. Subsequently, the protective member 105 was lathe-machined so that it is the same or slightly smaller than the outer dimension of the plate member 102. The side surface of the protective member 105 facing the plate member 102 is worked to be lower than the bonding surface of the base member 107. The protective member 105 is also worked to have a substantially letter-L shaped cross-section or a tapered cross-section such that the thickness of the outer rim is larger than the thickness of the inner rim.

A silicone adhesive is then uniformly applied on the bonding surface of the base member 107 by screen printing to fix the plate member 102. The space 106 can be easily filled with the adhesive by applying the silicone adhesive also on the side surface of the protective member in this step.

Example 1

A circular plate composed of an aluminum nitride sintered body having a diameter of 300 mm and a thickness of 3 mm was prepared. A nickel film was deposited on a main surface opposite to a supporting surface and subjected to blasting to remove unnecessary portions and to thereby form a pair of electrodes for electrostatic chucking made of nickel.

The position of forming the recess for accommodating a protective member was determined to be along the rim of the upper surface of the base member. A notch for forming the recess was formed in the rim portion of the upper surface of the base member. A protective member composed of Teflon® resin was formed to have an inner diameter smaller than the outer diameter of the notch in the base member by 20 to 100 μm. The protective member composed of Teflon® resin was retained under heating in a drier at 100° C., expanded until the protective member was larger than the outer diameter of the notch in the base member, and then press-fitted into the notch in the base member. The upper end surface of Teflon® was resin was ground to be smaller than the bonding surface of the base member and the plate member by 30 μm so that a space was formed between the plate member and the protective member. The plate member was fixed onto the base member with a silicone adhesive and was ground to a thickness of 1 mm. The supporting surface was then shaped to form Sample 1 having a cross-section shown in FIG. 3A.

Figure 9:
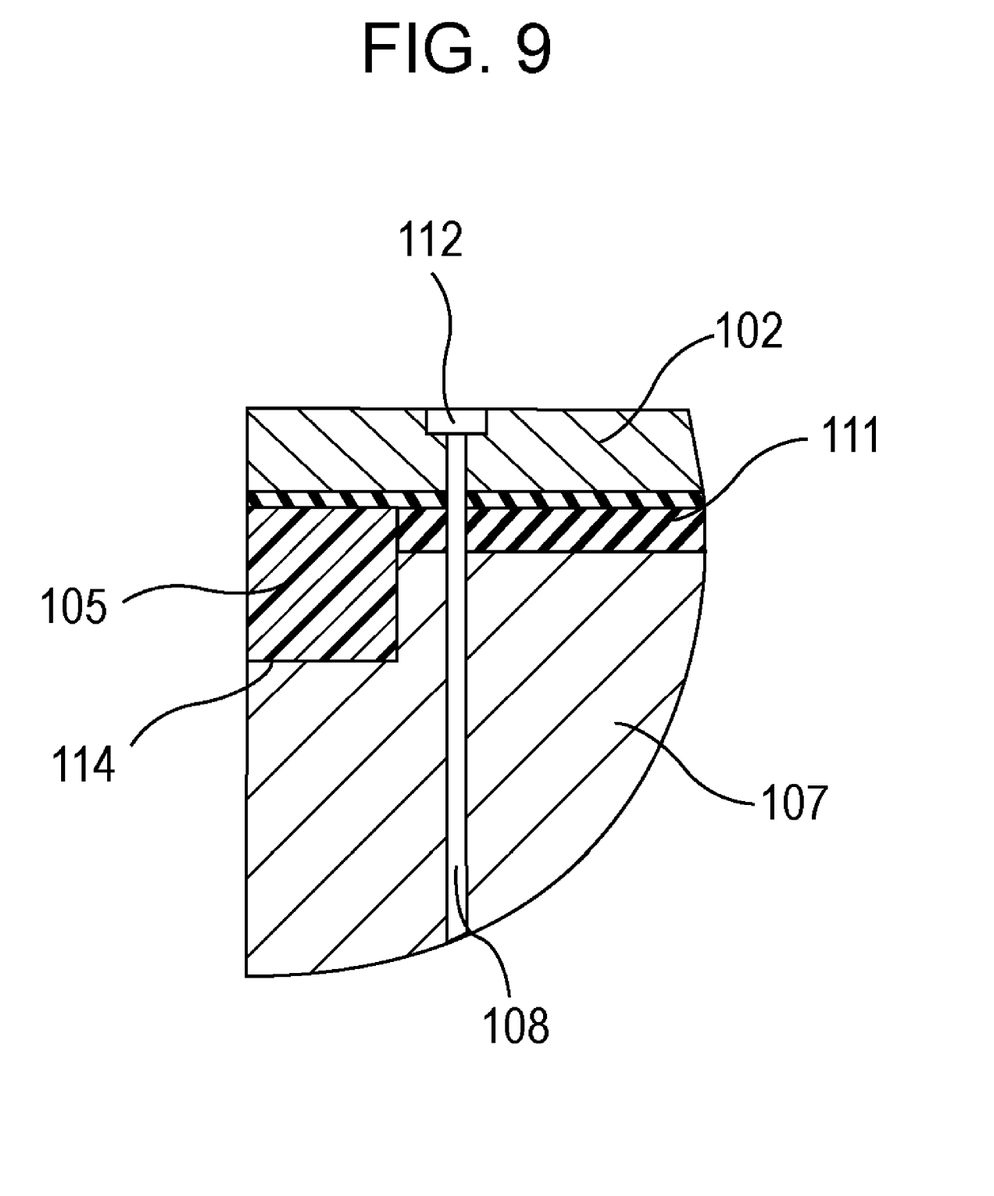
FIG. 9 is a schematic cross-sectional view showing a recess in an existing susceptor.

As a comparative example, Sample 2 having a structure similar to the structure of the conventional art was prepared. In Sample 2, the upper side surface of the Teflon® resin was at the same level as the bonding surface of the base member and the plate member as shown in FIG. 9.

The outer diameter of the protective member was the same as the outer diameter of the plate member in each example.

A wafer was chucked and retained on each sample in vacuum, helium gas was supplied from gas supply holes at a pressure of 2666 Pa at room temperature, and the amount of leaking helium gas was measured with a flowmeter. The wafer was then irradiated with oxygen plasma, helium gas was supplied at a pressure of 2666 Pa at the time temperature detected by a thermocouple (not shown) preliminarily disposed on the lower surface of the plate member reached 80° C., and the amount of leaking helium gas was measured with a flowmeter. The difference in amount of leaking helium gas between room temperature and 80° C. was compared. The results are shown in Table 1.

TABLE 1

| Sample No. | Presence of space | Amount of leaking helium gas at room temperature (SCCM) | Amount of leaking helium gas at 80° C. (SCCM) | Difference in amount of leaking helium gas (SCCM) |
|---|---|---|---|---|
| 1 | Yes | 5.8 | 6.7 | 0.9 |
| 2* | No | 5.3 | 22.8 | 17.5 |

*Asterisked sample was outside the range of the present invention.

The results show that the difference in amount of leaking gas between at room temperature and at 80° C. in Sample 1 with a space between the plate member and the protective member was only 0.9 SCCM, and no substantial change was observed. This was presumably because the space between the plate member and the protective member absorbed the thermal expansion of the protective member even when the operation temperature was increased and the protective member thermally expanded in the thickness direction, and prevented the plate member from being pushed upward. Thus, the supporting surface remained undeformed and could chuck and retain the wafer in a satisfactory manner.

In contrast, Sample 2 with no space between the plate member and the protective member exhibited a difference in amount of leaking helium as large as 17.5 SCCM. It was found that the amount of leaking helium increased with the increase in operation temperature. This is presumably because the protective member thermally expanded in the thickness direction due to high operation temperature and pushed the plate member upward, thereby deforming the supporting surface and generating minute gaps between the wafer and the supporting surface, which allowed helium gas to leak. As a result, the degree of vacuum inside the chamber decreased.

These results show that it is preferable to provide a space between the plate member and the protective member.

Example 2

In order to study effects induced by the position of forming the recess, Sample 1 with a recess formed in the base member as shown in FIG. 3A, Sample 3 with a recess formed in the plate member as shown in FIG. 3B, and Sample 4 with a recess formed across in both the plate member and the base member as shown in FIG. 3C were prepared. The thickness of the base member was 1 mm in Sample 1, 5 mm in Sample 3, and 3 mm in Sample 4.

Each sample with a wafer chucked thereon in vacuum was exposed to oxygen plasma for 100 hours, and the number of particles 0.1 μm or larger and the number of particles 1 μm or larger deposited on the wafer were measured with a particle counter. The results are shown in Table 2.

TABLE 2

| Sample No. | Presence of space | Form of recess (see FIGS. 3A to 3C) | No. of particles 0.1 μm or larger | No. of particles 1 μm or larger |
|---|---|---|---|---|
| 1 | Yes | FIG. 3A | 376 | 21 |
| 3 | Yes | FIG. 3B | 352 | 17 |
| 4 | Yes | FIG. 3C | 289 | 13 |

The numbers of the particles 0.1 μm or larger in Samples 1 and 3 with a recess formed in the plate member and the base member, respectively, were 376 and 352. The number of particles 0.1 μm or larger in Sample 4 with a recess formed across in the plate member and the base member was 289, which was slightly smaller that that in Sample 1 or 3.

The numbers of particles 1 μm or larger in Samples 1 and 3 were 21 and 17, respectively, whereas the number was smaller in Sample 4, i.e., 13.

The particles were qualitatively analyzed. Aluminum and silicon were detected from the particles 0.1 μm or larger in Samples 1 and 3. Only aluminum was detected from the particles 0.1 μm or larger in Sample 4. A fluoric component and a small amount of silicon were detected from the particles 1 μm or larger in Samples 1 and 3. Only a fluoric component was detected from the particles 1 μm or larger in Sample 4.

It can be assumed from these analytic results that the aluminum component in the particles is derived from aluminum nitride ceramic which constituted the plate member, and the fluoric component is derived from Teflon® which constituted the protective member. Moreover, it can also be assumed that the silicon component is derived from the silicone adhesive. The amount of silicon was notably lower than that of a conventional product having no protective member as shown in FIG. 7.

This was presumably because the adhesive was corroded with a small amount of plasma entering from the bonding layer through the bonding interface between the protective member and the base member, thereby generating particles. When the recess was formed in the base member, particles derived from the bonding layer through the space were generated. In contrast, when the recess was formed in the plate member and the base member, the bonding layer was completely covered with the protective member and no particles derived from the bonding layer were generated.

These results show that by forming a recess for accommodating a protective member in a plate member or a base member, preferably in both the plate member and the base member, exposure of the bonding layer to a plasma atmosphere can be suppressed.

Example 3

In order to study the effect derived from the correlation between the outer diameter of the protective member and the outer diameter of the plate member, Sample 5 in which the outer diameter of the protective member was 1 mm larger than the outer diameter of the plate member in a radial direction, Sample 1 in which the outer diameter of the protective member was controlled to be the same as the outer diameter of the plate member by simultaneous grinding, and Sample 6 in which the outer diameter of the protective member was 1 mm smaller than the outer diameter of the plate member in a radial direction were prepared.

Each sample with a wafer chucked thereon in vacuum was exposed to oxygen plasma for 100 hours, and the number of particles 0.1 μm or larger and the number of particles 1 μm or larger deposited on the wafer were measured with a particle counter. The results are shown in Table 3.

TABLE 3

| Sample No. | Presence of space | Form of recess (see FIGS. 3A to 3C) | Correlation between outer dia. of protective member and outer dia. of plate member<br>A: Outer dia. of the protective member was larger<br>B: Outer dia. was the same<br>C: Outer dia. of the protective member was smaller | No. of particles 0.1 μm or larger | No. of particles 1 μm or larger |
|---|---|---|---|---|---|
| 5 | Yes | FIG. 3A | A | 397 | 45 |
| 1 | Yes | FIG. 3A | B | 376 | 21 |
| 6 | Yes | FIG. 3A | C | 342 | 16 |

The results show that the numbers of the particles 0.1 μm or larger and the particles 1 μm or larger were 397 and 45, respectively, in Sample 5 with the protective member larger than the plate member in outer diameter, whereas the numbers were 376 and 21, respectively, for Sample 1 with the same outer diameter, and 342 and 16, respectively, for Sample 6 with the protective member smaller than the plate member in outer diameter. This shows the number of particles is smaller for a sample with a protective member having an outer diameter the same as or smaller than that of the plate member.

The particles were qualitatively analyzed. A fluoric component was detected from particles 1 μm or larger. This shows that the particles 1 μm or larger include particles derived from Teflon® resin which is the constituent of the protective material. This was presumably because the protective member protruding from the outer rim of the plate member was directly exposed to plasma, thereby causing plasma to be concentrated in corner portions and the like of the protective member and easily generating particles. The results show that the rim of the protective member is preferably at the same position as or at the inner side of the rim of the plate member.

Example 4

Samples 1 and 7 to 10 with protective members composed of Teflon® having cross-sections shown in FIGS. 3A and 4A to 4D, respectively, were prepared. The space between the upper end surface of the protective member and the lower surface of the plate member was about 10 μm. Whether the protective member pushed the plate member and deformed the supporting surface as the protective member was thermally expanded upward at an increasing temperature was examined by measuring the amount of helium gas leaking from the space between the supporting surface and the wafer chucked on the wafer.

The method of inspection was as in EXAMPLE 1. A wafer was chucked on each sample in vacuum, helium gas was supplied from gas supply holes at a pressure of 2666 Pa at room temperature, and the amount of leaking helium gas was measured with a flowmeter. The wafer was then irradiated with oxygen plasma, helium gas was supplied at a pressure of 2666 Pa at the time temperature detected by a thermocouple (not shown) preliminarily disposed on the lower surface of the plate member reached 80° C., and the amount of leaking helium gas was measured with a flowmeter. The difference in amount of leaking helium gas between room temperature and 80° C. was compared.

In order to identify particles generated from the bonding layer through the space, each sample with a wafer chucked thereon in vacuum was exposed to oxygen plasma for 100 hours and the number of particles 0.1 μm or larger and the number of particles 1 μm or larger deposited on the wafer were measured with a particle counter. The results are shown in Table 4.

The results showed that when the cross-sectional shape of the protective member was rectangular as in Sample 1, the difference in amount of leaking helium gas between room temperature and 80° C. was 0.9 SCCM. The difference in amount of leaking helium gas between room temperature and 80° C. was slightly larger, i.e., 1.2 SCCM or less, than Sample 1 in Samples 7 to 10 having protective members with a stepshaped or sloped cross-section higher at the rim side and lower at the inner boundary side.

In counting the particles, whereas Sample 1 with a space about 30 μm in size between the upper end surface of the protective member and the lower surface of the plate member yielded 376 particles 0.1 μm or larger, Samples 7 to 10 with a space about 10 μm in size yielded fewer particles, i.e., 328 or less.

This shows that generation of particles from the bonding layer was suppressed by decreasing the size of the space and thereby inhibiting entrance of plasma.

In this manner, when the protective member has a stepshaped or sloped cross-section having the upper surface higher at the rim and lower at the inner side, leakage of helium gas can be stabilized since the plate member is not pushed upward even in increased operation temperature. Moreover, since the space between the upper end surface of the protective member and the lower surface of the plate member is smaller, generation of particles from the bonding layer can be suppressed.

Example 5

In order to confirm that it is preferable to make the Young's modulus of the protective member composed of Teflon® resin larger than the Young's modulus of the bonding layer that bonds the plate member to the base member, Sample 11 in which an epoxy adhesive was used so that the cured bonding layer bonding the plate member to the base member had a Young's modulus larger than that of the protective member composed Teflon® resin and Sample 12 in which a silicone adhesive with a smaller Young's modulus was used for bonding were prepared. The Young's modulus of the protective member composed of Teflon™ was 0.5 GPa, the Young's modulus of the epoxy adhesive was 2.0 GPa after cure, and the Young's modulus of the silicone adhesive was 0.002 GPa after cure. The protective member had a cross-sectional shape of shown in FIG. 2A, and the space between the upper end surface of the protective member and the lower surface of the plate member was 30 μm.

Each sample with a wafer chucked thereon in vacuum was exposed to oxygen plasma for 100 hours and the number of particles 0.1 μm or larger and the number of particles 1 μm or larger deposited on the wafer were measured with a particle counter. The results are shown in Table 5.

TABLE 4

| Sample No. | Cross-sectional shape of protective member (see FIGS. 3A and 4A to 4D) | Amount of leaking helium gas at room temperature (SCCM) | Amount of leaking helium gas at 80° C. (SCCM) | Difference in amount of leaking helium gas (SCCM) | No. of particles 0.1 μm or larger | No. of particles 1 μm or larger |
|---|---|---|---|---|---|---|
| 1 | FIG. 3A | 5.8 | 6.7 | 0.9 | 376 | 21 |
| 7 | FIG. 4A | 5.5 | 6.6 | 1.1 | 312 | 15 |
| 8 | FIG. 4B | 5.3 | 6.3 | 1.0 | 321 | 14 |
| 9 | FIG. 4C | 5.4 | 6.2 | 0.8 | 328 | 12 |
| 10 | FIG. 4D | 5.1 | 6.3 | 1.2 | 326 | 16 |

TABLE 5

| Sample No. | Cross-sectional shape of protective member (see FIG. 2A) | Material of bonding layer | Magnitude relationship between Young's modulus of protective member and Young's modulus of bonding layer | No. of particles 0.1 μm or larger | No. of particles 1 μm or larger |
|---|---|---|---|---|---|
| 11 | No step/ No slope | Epoxy adhesive | Young's modulus of bonding layer is larger than that of protective layer | 374 | 38 |
| 12 | No step/ No slope | Silicone adhesive | Young's modulus of protective member is larger than that of bonding layer | 334 | 14 |

When the samples were compared based on the number of particles 1 μm or larger, Sample 12 in which the Young's modulus of the protective member was larger than that of the bonding layer yielded 14 particles, whereas Sample 11 in which the Young's modulus of the bonding layer was larger than that of the protective member yielded more particles, i.e., 38 particles.

This was because the adhesive flowed into and was cured in part of the space between the upper end surface of the protective member and the lower surface of the plate member, thereby causing an increase in temperature during exposure to the oxygen plasma. As the protective member was thermally expanded, the protective member was pressed by the adhesive having a higher Young's modulus and protruded from the rim of the plate member, thereby causing concentration of plasma in corner portions of the protective member and generating particles.

These results show that the Young's modulus of the protective member is preferably larger than the Young's modulus of the adhesive bonding the plate member to the base member.

Example 6

In order to confirm that it is preferable to form the space between the lower surface of the plate member and the upper surface of the protective member, Sample 13 having a space formed between the lower surface of the plate member and the upper surface of the protective member as shown in FIG. 5A and Sample 14 having a space formed between the lower surface of the protective member and the upper surface of the base member shown in FIG. 5B were prepared.

In forming a space between the lower surface of the plate member and the upper surface of the protective member as shown in FIG. 5A, the end surface of the protective member was worked to protrude from the adhesive-applied surface of the base member by about 50 μm, and a silicone adhesive was uniformly applied by screen printing. Since the thickness of the applied adhesive was about 100 to 120 μm, the plate member was bonded and fixed by thermally setting the adhesive at about 80° C. and, meanwhile, the adhesive was adequately contracted by curing so as to form a space about 30 μm between the lower surface of the plating member and the upper surface of the protective member.

In forming a space between the lower surface of the protective member and the upper surface of the base member as shown in FIG. 5B, it was necessary to form a space at the time the protective member was fitted in the base member. Thus, a spacer about 30 μm thick was preliminarily placed on the upper surface of the base member and then the protective member was fitted such that the protective member was disposed on the spacer to form the space therebelow. Subsequently, the upper surface was worked such that it lied at substantially the same level as the surface of the bonding layer, the adhesive was applied thereon, and the plate member was pressed against the protective member while thermally curing the adhesive at about 80° C. to fix the plate member. As a result, a space was formed between the lower surface of the protective member and the upper surface of the base member. The thickness of the plate member was 3 mm.

After bonding, the flatness of the plate member was measured. The flatness was measured with a three-coordinate measurer at arbitrarily selected 21 positions including the center of the supporting surface of the plate member and 8 positions about 2 mm inside the rim of the plate member taken at every 45 degrees. The difference between the maximum value and the minimum value was assumed to be the flatness.

The plate member was further ground to a thickness of 1 mm, the supporting surface of the plate member was shaped to form a susceptor, and the chucking force of the supporting surface was measured. Measurement was conducted at the center and near the rim of the supporting surface, and the difference between the chucking force at the center and the chucking force in the rim was assumed as a variation of the chucking force. A 1-inch square wafer was placed on the supporting surface and chucked thereon by supplying electricity to the electrode for electrostatic chucking, and the force required to separate wafer from the supporting surface per unit area was assumed as the chucking force. In the measurement, 500 V was applied to the single electrode for 10 seconds, and then the wafer was separated to measure the chucking force. The results are shown in Table 6.

TABLE 6

| Sample No. | Position of space | | Flatness after bonding (μm) | Difference between chucking force at the center and at the rim (Pa) |
|---|---|---|---|---|
| 13 | Between plate member and protective member | FIG. 5A | 13.7 | 917 |
| 14 | Between protective member and base member | FIG. 5B | 87.5 | 7810 |

The results show that in Sample 13 having a space between the lower surface of the plate member and the upper surface of the protective member, the flatness of the plate member after bonding was at a satisfactory level of 13.7 μm. In Sample 14 having a space between the lower surface of the protective member and the upper surface of the base member, the flatness of the plate member after bonding was as large as 87.5 μm. In the plate member of Sample 14, the central portion was recessed and the rim portion was protruded. This was presumably due to the following reasons: When the plate member was bonded by curing the adhesive under heating at 80° C., the adhesive became cured while the base member was thermally expanded in the thickness direction; thus, once cooled to room temperature, the base member shrunk more extensively than the rim portion of the plating member in contact with the protective member, thereby causing the rim of the plate member to protrude.

In contrast, in Sample 13 having a space formed between the lower surface of the plate member and the upper surface of the protective member, although the base member was slightly warped as it was cooled to room temperature, the space between the protective member and the plate member prevented the rim of the plate member from being pushed upward. Thus, the amount of warpage was reduced.

Since the flatness of the plate member of Sample 13 was satisfactory, i.e., 13.7 μm, the difference in chucking force between the center and the rim was small, i.e., 917 Pa, indicating uniform flatness. In contrast, in Sample 14 with the plate member having a large flatness of 87.5 μm, the difference in chucking force between the center and the rim was as large as 7,810 Pa.

These results show that it is more preferable to form a space between the lower surface of the plate member and the upper surface of the protective member.

Example 7

Sample 15 as shown in FIG. 6A was prepared. The protective member was composed of Teflon® resin, the width of the space was about 30 μm, and a silicone adhesive was used to fill the space. In preparing Sample 15, the adhesive was filled in the space by preliminarily applying the silicone adhesive on the upper surface of the protective member composed of Teflon® resin before bonding the plate member on the base member.

As a comparative example, Sample 1 including a space not filled with an adhesive as shown in FIG. 2A was prepared.

Each sample with a wafer chucked thereon in vacuum was exposed to oxygen plasma for 100 hours, and the number of particles 0.1 μm or larger and the number of particles 1 μm or larger deposited on the wafer were measured with a particle counter. The results are shown in Table 7.

TABLE 7

| Sample No. | Presence of adhesive in the space | No. of particles 0.1 μm or larger | No. of particles 1 μm or larger |
|---|---|---|---|
| 15 | Yes | 286 | 7 |
| 1 | No | 376 | 21 |

The results showed that the number of particles 1 μm or larger was 7 in Sample 15 having a space filled with the adhesive, which was further smaller than 21 in Sample 1 having a space not filled with the adhesive.

This was because the adhesive filling the space made the exposed surface of the protective member smooth and suppressed concentration of plasma, thereby decreasing the particles derived from the protective member.

The results show that it is preferable to fill the space with an adhesive since generation of particles from the protective member can be suppressed.

Example 8

Samples were prepared in the same manner as Sample 15 of EXAMPLE 7 but with different adhesives as follows. In order to confirm the effect of elongation of the adhesive filling the space, Samples 16 to 19 were prepared using silicone adhesives with different elongations ranging from 50% to 250%. These adhesives were selected from a catalog provided by GE Toshiba Silicone Co., Ltd. In particular, an adhesive with an elongation of 50% was TSE3331, an adhesive with an elongation of 100% was TSE3330, an adhesive with an elongation of 180% was TSE326M, and an adhesive with an elongation of 250% was TSE3260.

A wafer was chucked on each sample in vacuum, helium gas was supplied from gas supply holes at a pressure of 2666 Pa at room temperature, and the amount of leaking helium gas was measured with a flowmeter. The wafer was then irradiated with oxygen plasma, helium gas was supplied at a pressure of 2666 Pa at the time temperature detected by a thermocouple (not shown) preliminarily disposed on the lower surface of the plate member reached 80° C., and the amount of leaking helium gas was measured with a flowmeter. The difference in amount of leaking helium gas between at room temperature and at 80° C. was compared. The results are shown in Table 8.

TABLE 8

| Sample No. | Presence of adhesive in the space | Elongation of adhesive (%) | Amount of leaking helium gas at room temperature (SCCM) | Amount of leaking helium gas at 80° C. (SCCM) | Difference in amount of leaking helium gas (SCCM) |
|---|---|---|---|---|---|
| 16 | Yes | 50% | 4.8 | 8.0 | 3.2 |
| 17 | Yes | 100% | 4.7 | 5.3 | 0.6 |
| 18 | Yes | 180% | 4.4 | 4.8 | 0.4 |
| 19 | Yes | 250% | 4.1 | 4.2 | 0.1 |

The results showed that the amount of leaking helium gas increased at high temperature in Sample 16 containing an adhesive having an elongation of 50%, and the difference in leaking amount between at room temperature and at 80° C. was slightly high, i.e., 3.2. SCCM. In contrast, in Samples 17 to 19 using adhesives having an elongation of 100% or more, the amount of leaking helium gas at high temperature was satisfactorily small, i.e., 0.6 SCCM or less. This was presumably because the thermal expansion of the protective member at an increased operation temperature was reduced by the bonding layer composed of an adhesive having a large elongation and the plate member was prevented from being pushed upward. As a result, deformation of the supporting surface and formation of a space between the wafer and the supporting surface were prevented, and the amount of leaking helium gas did not increase. These results show that the elongation of the adhesive that fills the space is preferably 100% or more.

What is claimed is:

1. A susceptor comprising:
a plate member having a rim portion, an upper workpiece supporting surface and a lower surface;
a base member bonded to the lower surface of the plate member with a bonding layer; and
an annular protective member disposed in an annular recess formed directly below the rim portion of the plate member wherein a space is formed between the lower surface of the plate member and an upper surface of the protective member and/or between an upper surface of the base member and a lower surface of the protective member.

2. The susceptor of claim 1 wherein:
the annular protective member has an inner diameter surface in contact with an outer diameter surface of the base member and/or an outer diameter surface of the bonding layer; and
the lower surface of the plate member and an upper surface of the protective member are spaced apart and/or an upper surface of the base member and a lower surface of the protective member are spaced apart.

3. The susceptor of claim 1 further comprising:
a guard ring surrounding a portion of the plate member and base member such that the annular protective member is shielded by the guard ring.

4. A susceptor comprising:
a plate member having a rim portion, an upper workpiece supporting surface and a lower surface;
a base member bonded to the lower surface of the plate member with a bonding layer; and
an annular protective member disposed in an annular recess formed along a rim of the bonding layer and directly below the rim portion of the plate member such that the lower surface of the plate member and an upper surface of the protective member are spaced apart and/or an upper surface of the base member and a lower surface of the protective member are spaced apart.

5. The susceptor according to claim 4, wherein the annular recess is formed in the plate member or the base member.

6. The susceptor according to claim 4, wherein the annular recess is formed across in both the plate member and the base member.

7. The susceptor according to claim 4, wherein a rim of the protective member is at the same position as or at the inner side of a rim of the plate member.

8. The susceptor according to claim 4, wherein the protective member has a step-shaped cross-section in which the upper surface thereof is high at an outer side and low at an inner side.

9. The susceptor according to claim 4, wherein the protective member has a sloped cross-section in which the upper surface thereof declines toward an inner side.

10. The susceptor according to claim 4, wherein the protective member has a Young's modulus higher than that of the bonding layer.

11. The susceptor according to claim 10, wherein the protective member comprises a fluorocarbon resin.

12. The susceptor according to claim 10, wherein the protective member is composed of a ceramic.

13. The susceptor according to claim 4, wherein the space is formed between the lower surface of the plate member and the upper surface of the protective member.

14. The susceptor according to claim 4, wherein the bonding layer is surrounded by the protective member.

15. The susceptor according to claim 4, wherein the space is filled with an adhesive.

16. The susceptor according to claim 15, wherein the adhesive has an elongation of 100% or more.

17. The susceptor according to claim 4, wherein an electrode for electrostatic chucking is provided inside the plate member or between the plate member and the base member.

18. The susceptor according to claim 17, wherein a heater is provided inside the plate member or between the plate member and the base member.

19. The susceptor according to claim 4, wherein a heater is provided inside the plate member or between the plate member and the base member.

20. The susceptor of claim 4 further comprising:
a guard ring surrounding a portion of the plate member and base member such that the annular protective member is shielded by the guard ring.

* * * * *